United States Patent
Takeuchi et al.

(10) Patent No.: US 7,002,871 B2
(45) Date of Patent: Feb. 21, 2006

(54) ASYNCHRONOUS PSEUDO SRAM AND ACCESS METHOD THEREFOR

(75) Inventors: Yoshiaki Takeuchi, Yokohama (JP); Kohei Oikawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 10/762,459

(22) Filed: Jan. 23, 2004

(65) Prior Publication Data

US 2005/0068837 A1    Mar. 31, 2005

(30) Foreign Application Priority Data

Sep. 30, 2003  (JP) .............................. 2003-340589

(51) Int. Cl.
  *G11C 8/00*    (2006.01)
(52) U.S. Cl. ......................... 365/230.01; 365/230.06; 365/230.08
(58) Field of Classification Search ........... 365/230.01, 365/230.06, 230.08
  See application file for complete search history.

(56) References Cited

U.S. PATENT DOCUMENTS 5,258,952 A * 11/1993 Coker et al. ................ 365/194
5,625,590 A * 4/1997 Choi et al. ............. 365/230.04
6,370,058 B1 * 4/2002 Fukumoto ............... 365/185.08
6,882,586 B1 * 4/2005 Sato et al. ................... 365/201

FOREIGN PATENT DOCUMENTS

| JP | 7-70214 | 7/1995 |
| JP | 2002-150768 | 5/2002 |
| JP | 2002-352576 | 12/2002 |

\* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A semiconductor integrated circuit device includes an address buffer which receives an address signal that indicates an address of a memory cell array, a latch circuit which latches the data, and an address transition detection circuit which detects transition of the address. During the access operation of the memory cell array, an address at the operation start time is latched by the latch circuit. After the end of the operation of the memory cell array, an address that is currently input to the address buffer is latched by the latch circuit. If the received address signal is data different from the latch data, a control signal that controls the cycle operation of the memory cell array for a predetermined period is generated on the basis of the detection result from the address transition detection circuit.

21 Claims, 9 Drawing Sheets

ASYNCHRONOUS PSEUDO SRAM AND ACCESS METHOD THEREFOR

CROSS-REFERENCE TO RELATED APPLICATIONS

This application is based upon and claims the benefit of priority from the prior Japanese Patent Application No. 2003-340589, filed Sep. 30, 2003, the entire contents of which are incorporated herein by reference.

BACKGROUND OF THE INVENTION

1. Field of the Invention

The present invention relates to a semiconductor integrated circuit device such as a semiconductor memory device and an access method therefor and, more particularly, to an asynchronous pseudo SRAM which uses a DRAM (Dynamic Random Access Memory) or ferroelectric memory in the memory core portion and an access method therefor.

2. Description of the Related Art

Pseudo SRAMs are commercially available, which use a DRAM or ferroelectric memory in the memory core portion to increase the degree of integration while maintaining use compatibility to existing SRAMs. In recent years, a demand for pseudo SRAMs oriented for cellular phones is increasing. Especially, a demand for asynchronous pseudo SRAMs which operate even asynchronously to an external input signal is growing.

Figure 1A:
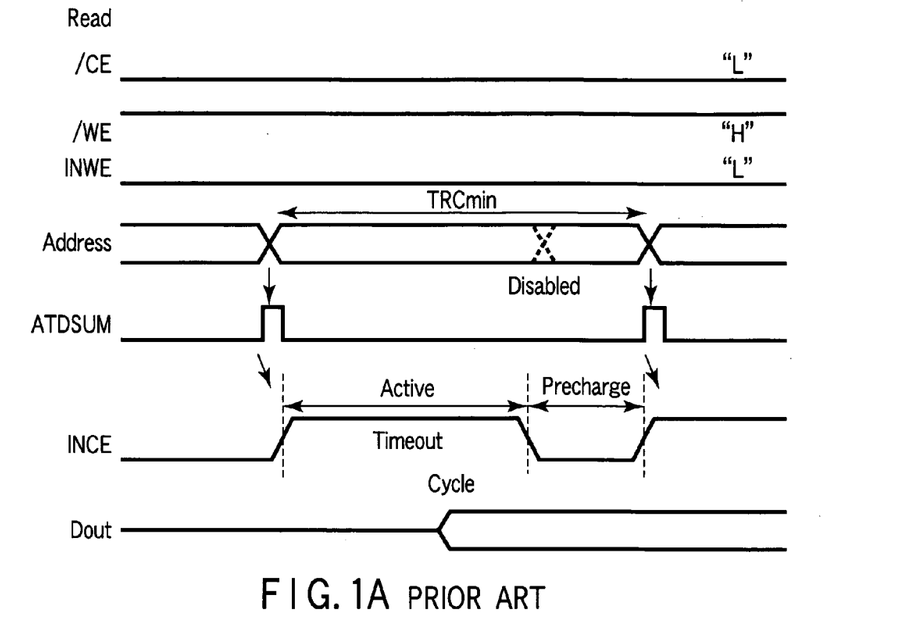
FIG. 1A is a timing chart showing a read operation so as to explain a conventional semiconductor integrated circuit device access method.
Figure 1B:
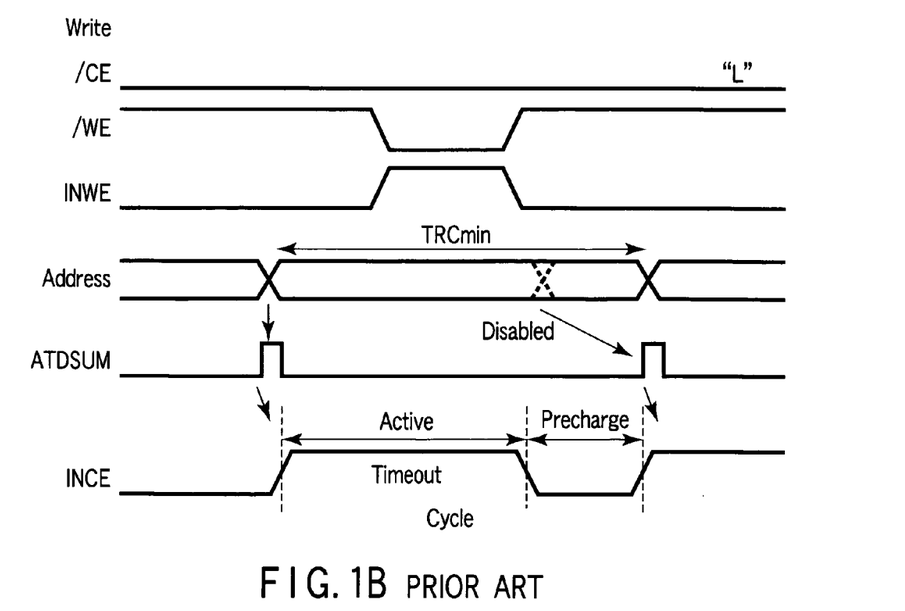
FIG. 1B is a timing chart showing a write operation so as to explain the conventional semiconductor integrated circuit device access method.

To implement an asynchronous pseudo SRAM, an operation as shown in the timing charts of FIGS. 1A and 1B is necessary. FIG. 1A shows a read operation. FIG. 1B shows a write operation.

Figure 2:
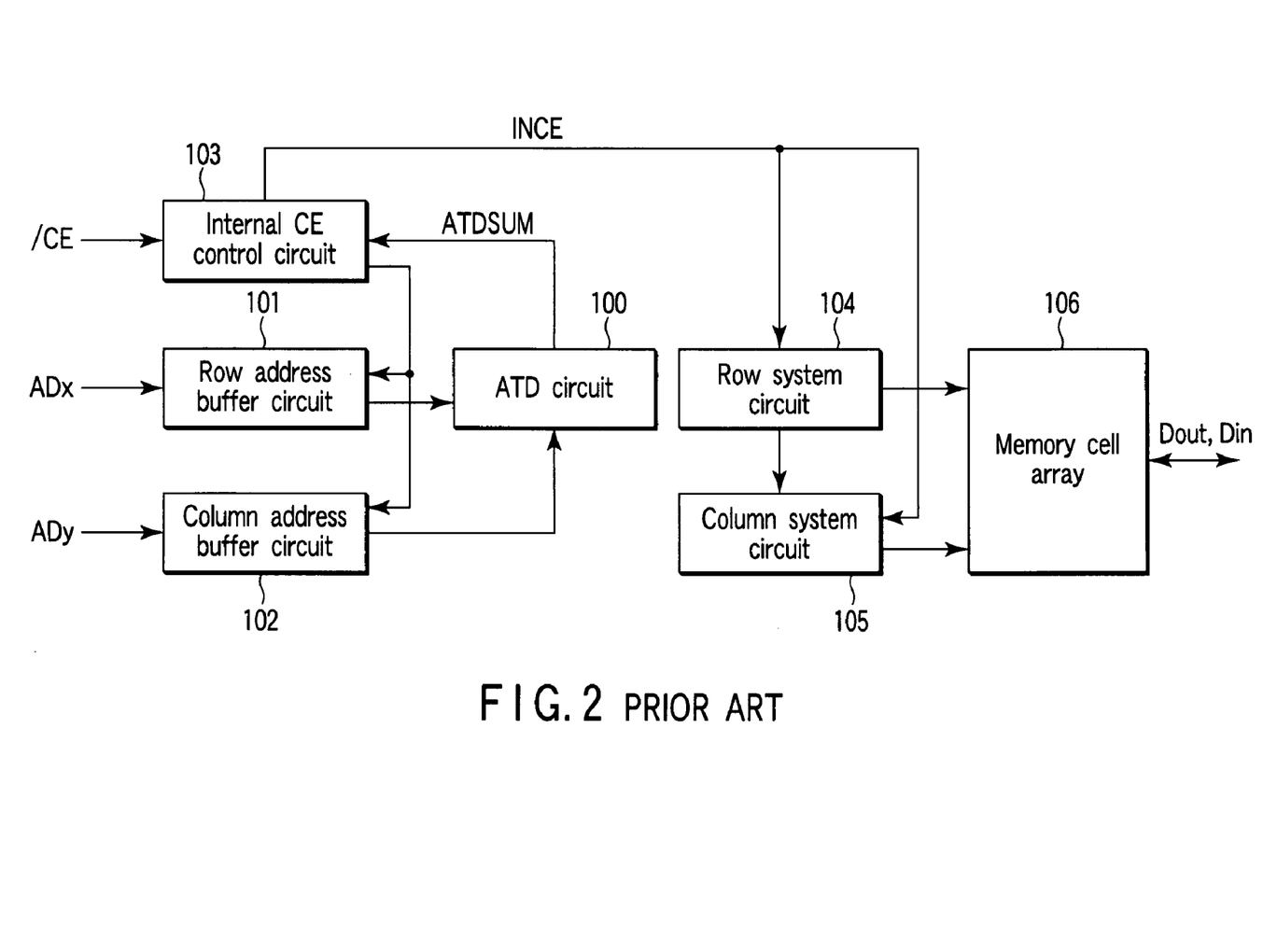
FIG. 2 is a block diagram showing the arrangement of part of a semiconductor memory device so as to explain a conventional semiconductor integrated circuit device.

To realize the read and write operations shown in FIGS. 1A and 1B, an arrangement shown in FIG. 2 can be used. This arrangement has a plurality of ATDs which detect address transition. Address transition is detected by these ATDs. On the basis of an AND signal ATDSUM of the detection results, an internal chip enable signal (internal circuit control signal) INCE that controls the internal circuits is generated. Time-series signals that drive a word line WL and plate line PL are generated from the internal chip enable signal INCE to control the internal circuits.

More specifically, as shown in FIG. 2, a row address signal ADx output from a row address buffer circuit 101 and a column address signal ADy output from a column address buffer circuit 102 are supplied to an ATD circuit (address transition detection circuit) 100 so that the transitions of row and column addresses are detected. On the basis of the AND signal ATDSUM of the detection result by the ATD circuit 100, the internal chip enable signal INCE that controls the internal circuits is generated by an internal CE control circuit 103. An external chip enable signal /CE is supplied to the internal CE control circuit 103 to control the operation of the row address buffer 101 and column address buffer 102. The internal chip enable signal INCE generated by the internal CE control circuit 103 is supplied to a row system circuit 104 and column system circuit 105. Time-series signals that drive the word line WL and plate line PL in a memory cell array 106 are generated to control the data read and write (Dout and Din) operations.

A ferroelectric memory or DRAM is a destructive read memory. This memory requires an operation for returning data in a sense amplifier to a memory cell and rewriting the data after data access. Especially, in a ferroelectric memory (to be described later in detail), "1" and "0" data must be separately rewritten.

Hence, the address cannot be changed during the operation cycle. An address must be input complying with the TRCmin rule. In addition, to prevent any internal data destruction or error, an address that is input outside this rule is neglected.

To the contrary, an SRAM is a nondestructive read memory. It has no rule about the address input timing in a read mode. An output is obtained in accordance with an address that is input at an arbitrary timing.

For this reason, the conventional destructive read memory cannot be completely compatible with the SRAM in terms of operation.

To solve this problem, for example, Jpn. Pat. Appln. KOKOKU Publication No. 07-70214 (patent reference 1) discloses a semiconductor memory device. In this device, if the address continuously changes at a short time interval, and the second address change occurs before the internal operation based on the first address change is ended, the pieces of information of the second and subsequent address changes are temporarily stored in the device. With this arrangement, the internal operation corresponding to the second and subsequent address changes can be started after the internal operation according to the first address change is completed.

Jpn. Pat. Appln. KOKAI Publication No. 2002-150768 (patent reference 2) discloses a semiconductor memory device having a latch timing control circuit. The latch timing control circuit stores information representing a change in address signal during the operation of the core circuit. After the operation of the core circuit is ended, the control circuit causes a latch circuit to latch the changed address signal.

In both patent references 1 and 2, address buffers must always be set in an operative state to detect a change in address during the cycle operation. The address buffers must convert an external input signal of TTL or LVTTL level into a MOS level, i.e., the level of the internal power supply. To do this, a small current is always supplied to the address buffers. In addition, about 20 address buffers are simultaneously operating. Hence, if these address buffers are always set in the operative state, power consumption increases. A device for a cellular phone particularly requires low power consumption. For this reason, a semiconductor memory device which has low power consumption and is compatible to an asynchronous SRAM in terms of operation needs to be implemented.

In the embodiment of patent reference 1, all address transitions are received, and internal operations corresponding to them are executed. Hence, if an operation cycle starts in accordance with erroneous data, the next operation cycle cannot start until that cycle is ended. For this reason, processing must wait for a time corresponding to at least one cycle until the correct operation cycle starts. In the worst case, processing must wait for time corresponding to several cycles until correct data is input.

On the other hand, in the arrangement of patent reference 2, an address change during the cycle operation is latched in advance. After the end of the operation of the core circuit, the latch circuit latches the changed address signal. The next cycle is started by using that address signal. In this arrangement, if the address further changes after the end of the operation of the core circuit, the device cannot immediately cope with it. Data corresponding to the address is read out with a delay of at least one cycle.

BRIEF SUMMARY OF THE INVENTION

According to an aspect of the present invention, there is provided a semiconductor integrated circuit device comprising a memory cell array, an address buffer which receives an address signal that indicates an address of the memory cell array, a latch circuit which latches the address signal output from the address buffer, an address transition detection circuit which detects transition of the address signal latched by the latch circuit upon receiving an address different from that latched by the latch circuit, and a control circuit which comprises a timeout circuit that controls a cycle operation of the memory cell array, controls operations of the address buffer and the latch circuit, causes the latch circuit to latch an address at operation start time, which is output from the address buffer, during the operation of the memory cell array, when the address transition detection circuit detects the transition of the address during the cycle operation, causes the latch circuit to latch, after an end of the operation of the memory cell array, an address that is currently input to the address buffer, and controls to execute the next cycle operation of the memory cell array in accordance with the address latched by the latch circuit.

According to another aspect of the present invention, there is provided a semiconductor integrated circuit device comprising a memory cell array, a row address buffer which receives a row address signal that indicates a row address of the memory cell array, a column address buffer which receives a column address signal that indicates a column address of the memory cell array, a CE buffer which receives an external chip enable signal, a WE buffer which receives an external write enable signal, a first row address latch which latches the row address signal output from the row address buffer, a second row address latch which latches the row address signal output from the first row address latch and outputs an internal row address signal, a first column address latch which latches the column address signal output from the column address buffer, a second column address latch which latches the column address signal output from the first column address latch and outputs an internal column address signal, a row address transition detection circuit which detects transition of the row address signal output from the first row address latch, a column address transition detection circuit which detects transition of the column address signal output from the first column address latch, a chip enable transition detection circuit which detects transition of the external chip enable signal output from the CE buffer, a write enable transition detection circuit which detects transition of the external write enable signal output from the WE buffer, an ATD AND circuit which ANDs detection results from the row address transition detection circuit, the column address transition detection circuit, the chip enable transition detection circuit, and the write enable transition detection circuit, and an internal CE control circuit which comprises a timeout circuit that controls a cycle operation of the memory cell array, controls a row system circuit and a column system circuit to access the memory cell array and also controls the row address buffer, the column address buffer, the first and second row address latches, and the first and second column address latches on the basis of an AND signal output from the ATD AND circuit, causes the first and second row address latches and the first and second column address latches to respectively latch a row address and a column address at operation start time, which are output from the row address buffer and the column address buffer, during the operation of the memory cell array, and when the row address transition detection circuit detects the transition of the row address or the column address transition detection circuit detects the transition of the column address during the cycle operation, causes the second row address latch and the second column address latch to respectively latch, after an end of the operation of the memory cell array, a row address and a column address that are currently latched by the first row address latch and the first column address latch so as to control access to the memory cell array.

According to still another aspect of the present invention, there is provided an access method for a semiconductor integrated circuit device including a memory cell array, an address buffer which receives an address signal that indicates an address of the memory cell array, a latch circuit which latches the address output from the address buffer, an address transition detection circuit which detects transition of the address, and a control circuit which comprises a timeout circuit that controls a cycle operation of the memory cell array on the basis of a detection result from the address transition detection circuit, comprising causing the latch circuit to latch an address at operation start time during the operation of the memory cell array, causing the address transition detection circuit to detect the transition of the address during the cycle operation, when the transition of the address is detected, causing the latch circuit to latch, after an end of the operation of the memory cell array, an address that is currently input to the address buffer, and executing the next cycle operation of the memory cell array in accordance with the address latched by the latch circuit.

According to still another aspect of the present invention, there is provided an access method for a semiconductor integrated circuit device including a memory cell array, a row address buffer which receives a row address signal that indicates a row address of the memory cell array, a column address buffer which receives a column address signal that indicates a column address of the memory cell array, a CE buffer which receives an external chip enable signal, a WE buffer which receives an external write enable signal, a first row address latch which latches the row address signal output from the row address buffer, a second row address latch which latches the row address signal output from the first row address latch and outputs an internal row address signal, a first column address latch which latches the column address signal output from the column address buffer, a second column address latch which latches the column address signal output from the first column address latch and outputs an internal column address signal, a row address transition detection circuit which detects transition of the row address signal output from the first row address latch, a column address transition detection circuit which detects transition of the column address signal output from the first column address latch, a chip enable transition detection circuit which detects transition of the external chip enable signal output from the CE buffer, a write enable transition detection circuit which detects transition of the external write enable signal output from the WE buffer, an ATD AND circuit which ANDs detection results from the row address transition detection circuit, the column address transition detection circuit, the chip enable transition detection circuit, and the write enable transition detection circuit, and an internal CE control circuit which comprises a timeout circuit that controls a cycle operation of the memory cell array, controls a row system circuit and a column system circuit to access the memory cell array, and also controls the row address buffer, the column address buffer, the first and second row address latches, and the first and second column address latches on the basis of an AND signal output from the ATD AND circuit, comprising causing the first and second row address latches and the first and second column address latches to respectively latch a row address and a column address at operation start time, which are output from the row address buffer and the column address buffer, during the operation of the memory cell array, causing the row address transition detection circuit to detect the transition of the row address or causing the column address transition detection circuit to detect the transition of the column address during the cycle operation, when the transition of the row address or column address is detected, causing the second row address latch and the second column address latch to respectively latch, after an end of the operation of the memory cell array, a row address and a column address that are currently latched by the first row address latch and the first column address latch, and executing the next cycle operation of the memory cell array in accordance with the addresses latched by the second row address latch and the second column address latch.

DETAILED DESCRIPTION OF THE INVENTION

[First Embodiment]

Figure 3:
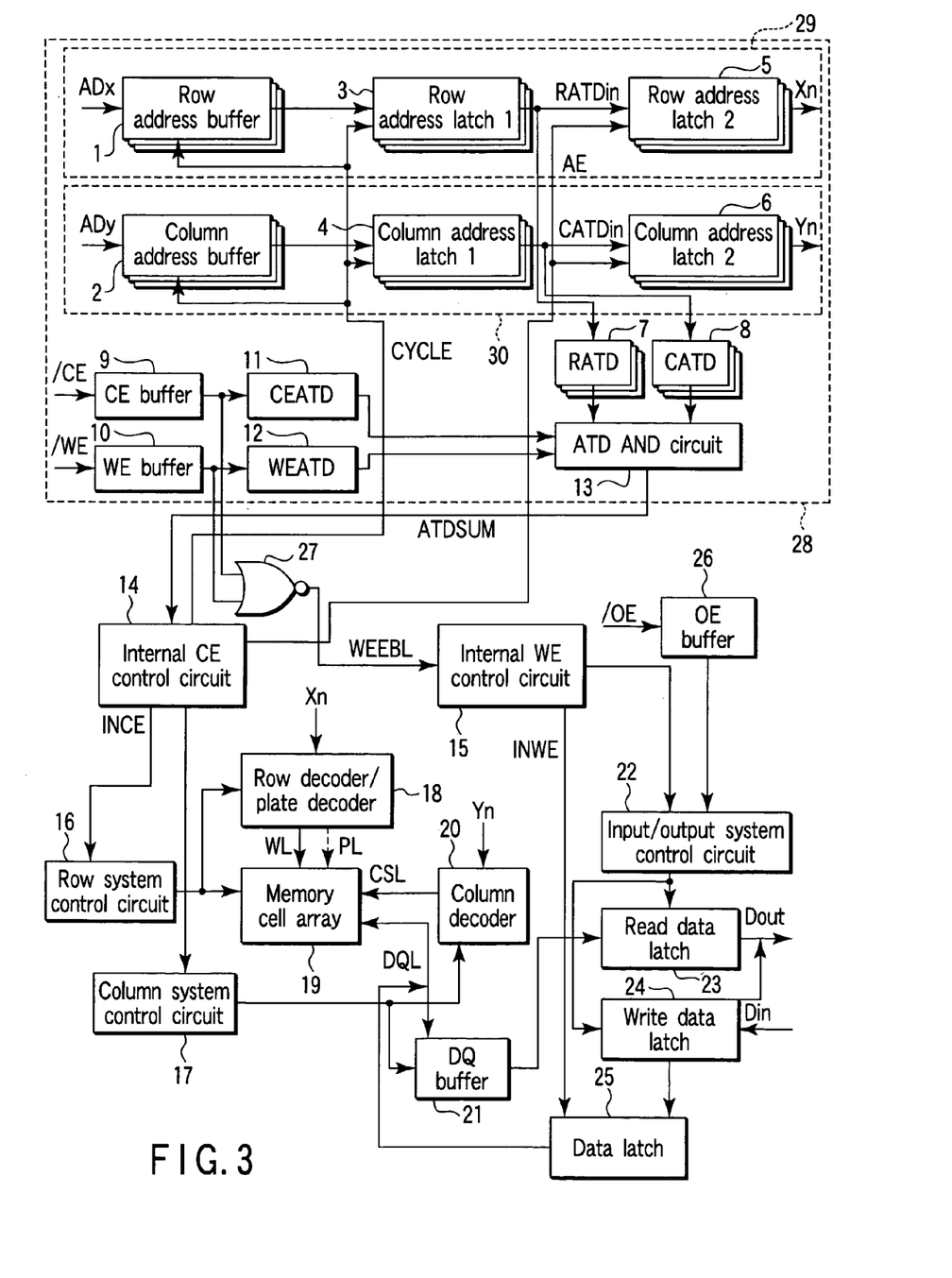
FIG. 3 is a block diagram showing the arrangement of the main part of an asynchronous semiconductor memory device so as to explain a semiconductor integrated circuit device according to the first embodiment of the present invention and an access method therefor.
Figure 4A:
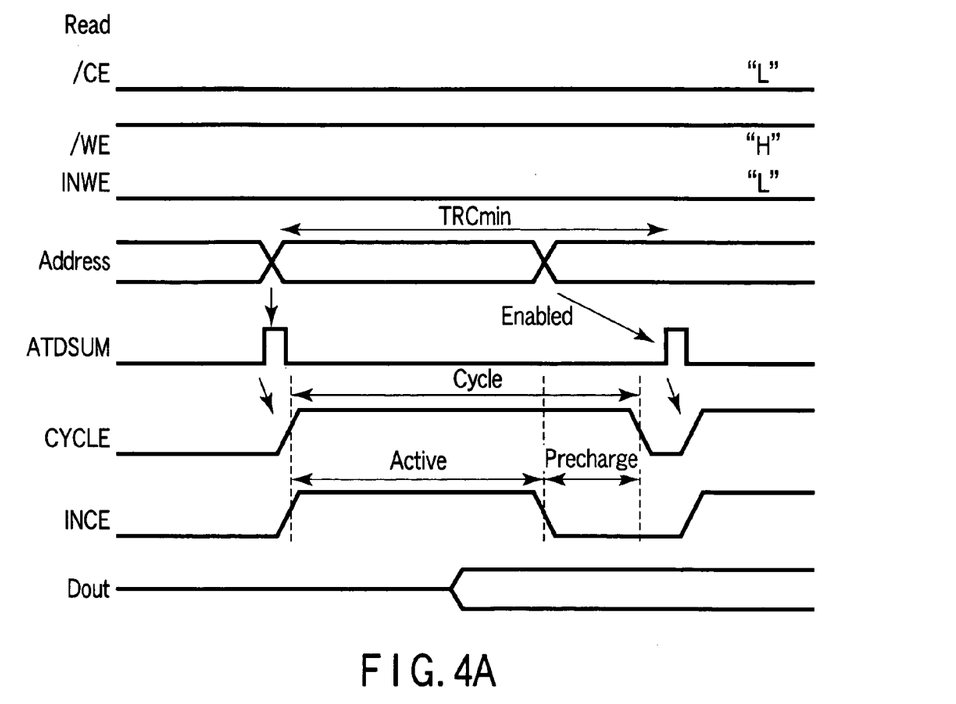
FIG. 4A is a timing chart showing a read operation so as to explain the operation of the semiconductor memory device shown in FIG. 3.
Figure 4B:
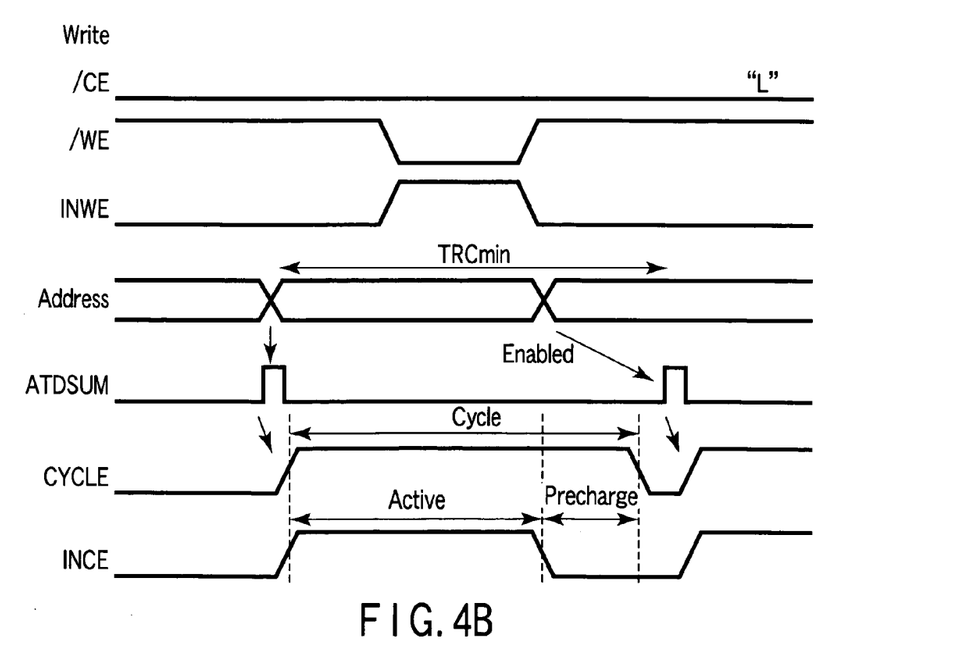
FIG. 4B is a timing chart showing a write operation so as to explain the operation of the semiconductor memory device shown in FIG. 3.
Figure 5A:
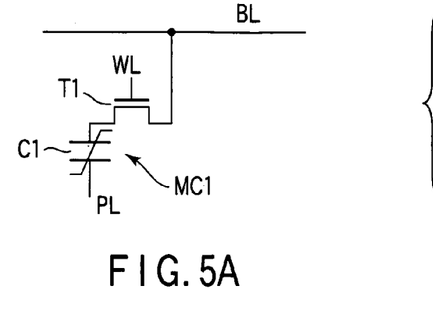
FIG. 5A is an equivalent circuit diagram showing a ferroelectric cell having a 1-transistor/1-capacitor structure so as to explain the structure of the memory cell array shown in FIG. 3.
Figure 5B:
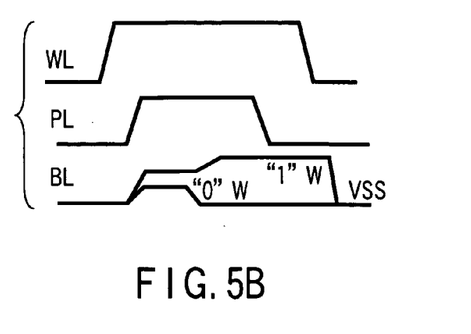
FIG. 5B is a timing chart showing the operation waveforms of the ferroelectric cell shown in FIG. 5A.
Figure 6:
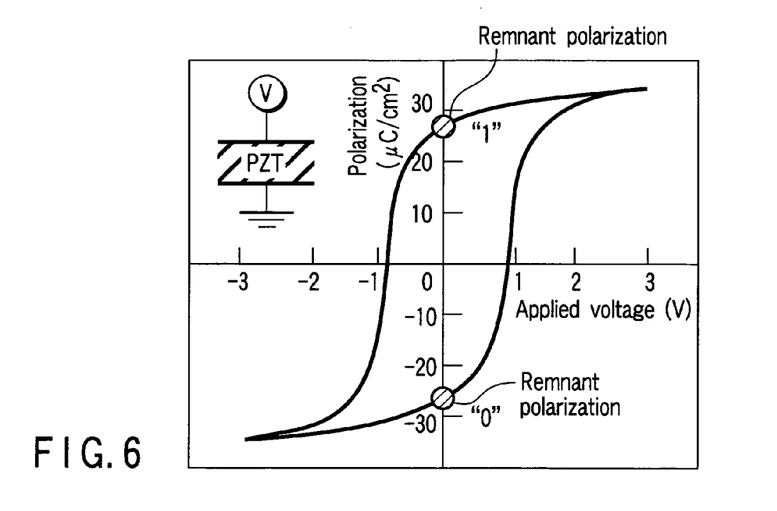
FIG. 6 is a graph showing the relationship (hysteresis characteristic) between the applied voltage and the remnant polarization of the ferroelectric cell shown in FIG. 5A.
Figure 7:
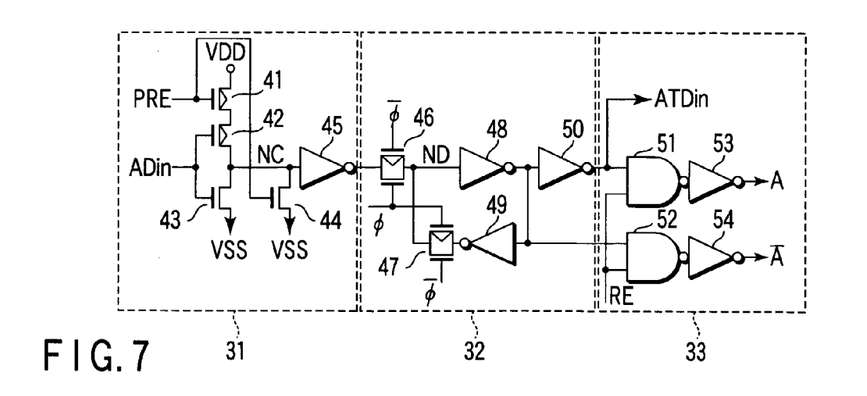
FIG. 7 is a circuit diagram showing the detailed arrangement of an address buffer and latch circuit shown in FIG. 3.
Figure 8:
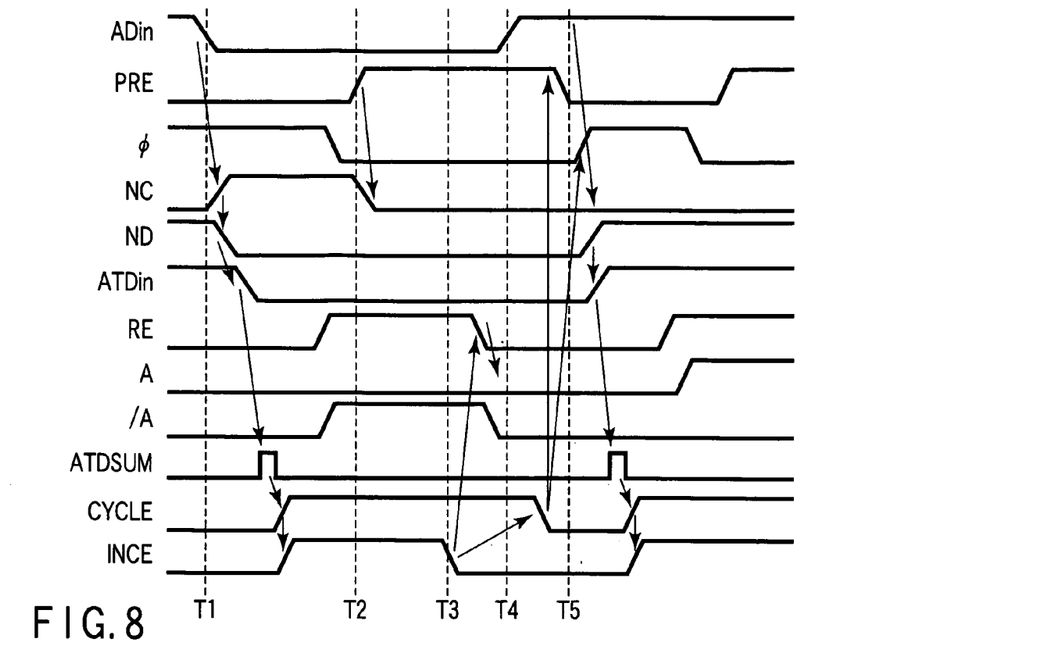
FIG. 8 is a timing chart for explaining the operations of the address buffer and latch circuit shown in FIG. 7.

FIGS. 3, 4A, 4B, 5A, 5B, 6, 7, and 8 are views for explaining a semiconductor integrated circuit device according to the first embodiment of the present invention and an access method therefor. FIG. 3 shows the arrangement of the main part of an asynchronous semiconductor memory device (pseudo SRAM). FIGS. 4A and 4B are timing charts showing the operation waveforms of the pseudo SRAM shown in FIG. 3. FIGS. 5A and 5B are views for explaining the structure of a memory cell in the memory cell array shown in FIG. 3. FIG. 5A is an equivalent circuit diagram, and FIG. 5B is a timing chart showing the operation waveforms. FIG. 6 shows an example of the relationship (hysteresis characteristic) between the applied voltage and the remnant polarization of the ferroelectric capacitor shown in FIG. 5A. FIG. 7 shows the detailed arrangement of an address buffer and latch circuit in the pseudo SRAM shown in FIG. 3. FIG. 8 is a timing chart showing the operation waveforms of the address buffer and latch circuit.

As shown in FIG. 3, the pseudo SRAM includes an input circuit & ATD circuit 28, internal CE control circuit 14, internal WE control circuit 15, row system control circuit 16, column system control circuit 17, row decoder/plate decoder 18, memory cell array 19, column decoder 20, DQ buffer 21, input/output system control circuit 22, read data latch 23, write data latch 24, data latch 25, OE buffer 26, and NOR circuit 27.

The input circuit & ATD circuit 28 comprises a row address buffer & latch circuit 29 and column address buffer & latch circuit 30. The row address buffer & latch circuit 29 includes a row address buffer 1, first row address latch 3, and second row address latch 5. The row address buffer 1 receives a row address signal ADx. The output signal from the buffer 1 is supplied to the first row address latch 3. An output signal RATDin from the latch 3 is supplied to the second row address latch 5. The operations of the row address buffer 1 and first row address latch 3 are controlled by a signal CYCLE that is output from the internal CE control circuit 14 to control the cycle. The operation of the second row address latch 5 is controlled by an internal address enable signal AE output from the internal CE control circuit 14. An output signal (internal row address signal) Xn from the circuit 29 is supplied to the row decoder section in the row decoder/plate decoder 18 so that selection and driving of a word line WL are controlled.

The column address buffer & latch circuit 30 includes a column address buffer 2, first column address latch 4, and second column address latch 6. The column address buffer 2 receives a column address signal ADy. The output signal from the buffer 2 is supplied to the first column address latch 4. An output signal CATDin from the latch 4 is supplied to the second column address latch 6. The operations of the column address buffer 2 and first column address latch 4 are controlled by the signal CYCLE that is output from the internal CE control circuit 14 to control the cycle. The operation of the second column address latch 6 is controlled by the internal address enable signal AE output from the internal CE control circuit 14. An output signal (internal column address signal) Yn from the circuit 30 is supplied to the column decoder 20 so that selection of a column select line CSL is controlled.

The input circuit & ATD circuit 28 also includes an RATD 7, CATD 8, CE buffer 9, WE buffer 10, CEATD 11, WEATD 12, and ATD AND circuit 13. The RATD 7 detects the transition of the output signal RATDin from the row address latch 3. The CATD 8 detects the transition of the output signal CATDin from the column address latch 4. An external chip enable signal /CE is supplied to the CE buffer 9. An external write enable signal /WE is supplied to the WE buffer 10. The output signals from the buffers 9 and 10 are supplied to the CEATD 11 and WEATD 12, respectively. The CEATD 11 is a chip enable transition detection circuit which detects the transition of the output signal (external chip enable signal /CE) from the CE buffer 9. The WEATD 12 is a write enable transition detection circuit which detects the transition of the output signal (external write enable signal /WE) from the WE buffer 10.

The signal transitions detected by the RATD 7, CATD 8, CEATD 11, and WEATD 12 are supplied to the ATD AND circuit 13 and ANDed. An AND signal ATDSUM output from the ATD AND circuit 13 is supplied to the internal CE control circuit 14. Accordingly, an internal chips enable signal INCE that controls the internal circuits for a predetermined period is generated.

The operations of the row system control circuit 16 and column system control circuit 17 are controlled by the internal chip enable signal INCE output from the internal CE control circuit 14. The row system control circuit 16 includes a plate control circuit and word line control circuit. The output signal from the row system control circuit 16 is supplied to the row decoder/plate decoder 18. The word line WL and a plate line PL are selected and driven by the row decoder/plate decoder 18. The row system control circuit 16 includes a sense amplifier control circuit to drive the sense amplifier in the memory cell array 19.

On the other hand, the output signal from the column system control circuit 17 is supplied to the column decoder 20. The column decoder 20 selects the column select line CSL in the memory cell array 19.

Write data Din to a selected memory cell in the memory cell array 19 is latched by the write data latch 24 and then written through the data latch 25 and a data line DQL. The write data Din latched by the write data latch 24 can be externally output. On the other hand, data read out from a selected memory cell is supplied to the DQ buffer 21 through the data line DQL. The data is further supplied to the read data latch 23 and output as readout data Dout.

The operations of the write data latch 24 and read data latch 23 are controlled by the input/output system control circuit 22. The input/output system control circuit 22 is controlled by an internal write enable signal INWE output from the internal WE control circuit 15 and the output signal from the OE buffer 26. An external output enable signal /OE is supplied to the OE buffer 26.

The output signals from the CE buffer 9 and WE buffer 10 are supplied to the input terminals of the NOR circuit 27. The NOR circuit 27 supplies a signal WEEBL to the internal WE control circuit 15 to start the write operation when both the external chip enable signal /CE and the external write enable signal /WE are at "L" level. The internal WE control circuit 15 controls the latch operation of the data latch 25.

A more detailed arrangement of the pseudo SRAM shown in FIG. 3 and the details of the access operation shown in FIGS. 4A and 4B will be described next with reference to FIGS. 5A, 5B, 6, 7, and 8.

Ferroelectric cells MC1 each having a 1-transistor/1-capacitor structure shown in FIG. 5A are arranged in a matrix in the memory cell array 19. In a cell capacitor C1 of the ferroelectric cell MC1, a ferroelectric material such as lead zirconate titanate ($PbZrTiO_3$: PZT) is used as a capacitor insulating film.

The structure and the data write, read, and rewrite operations of the ferroelectric cell MC1 will be briefly described with reference to FIGS. 5A, 5B, and 6.

The data write operation for the ferroelectric cell MC1 is executed in the following manner. The word line WL is selected. In this state, the plate line PL is pulse-driven from the ground potential. ("L" level) to a predetermined potential ("H" level) and then returned to "L" level. With this operation, data on a bit line BL can be written.

In the read operation for data stored in the ferroelectric cell MC1, the word line WL is selected. In this state, the plate line PL is pulse-driven from "L" level to "H" level. With this operation, charges can be read out to the bit line BL.

More specifically, when no voltage is applied between the electrodes, the cell capacitor C1 of the ferroelectric cell MC1 shown in FIG. 5A has one of polarization states in two, upward and downward directions indicated by "0"and "1" in FIG. 6. That is, the ferroelectric cell MC1 is a nonvolatile memory. In this state, a voltage is applied. In the state "1", the polarization is not reversed. In the state "0", the polarization is reversed. The charge amount necessary for applying the same voltage, i.e., the charge amount generated in one electrode in accordance with the "0" or "1" storage state when the same voltage is applied to the other electrode changes between the two states. Stored data is read out by detecting the difference. The data read from such a ferroelectric memory is a destructive read. A rewrite operation must always be executed after the read operation.

The data rewrite operation for the ferroelectric cell MC1 shown in FIG. 5A will be described. For read data "0", the rewrite operation of the data "0" is executed when it is sense-amplified by the sense amplifier in the read mode, as shown in FIG. 5B. To the contrary, for read data "1", the plate line PL is returned from "H" level to "L" level, and the rewrite operation of the data "1" is then started.

The operations of the row address buffer & latch circuit 29 and column address buffer & latch circuit 30 in the pseudo SRAM shown in FIG. 3 will be described.

The ATD AND circuit 13 generates the pulse ATDSUM upon detecting the transition of an address signal. Triggered by the pulse ATDSUM, the internal CE control circuit 14 generates control signals for a predetermined period. The control signals are, e.g., the internal chip enable signal INCE that controls the active cycle and precharge cycle of the chip and the cycle control signal CYCLE that controls the total cycle time of the two cycles.

The operations of the row address buffer & latch circuit 29 and column address buffer & latch circuit 30 are controlled by the cycle control signal CYCLE. When the cycle control signal CYCLE is at "H" level, the row address buffer 1 and column address buffer 2 are activated. Accordingly, the row address buffer 1 and column address buffer 2 receive the addresses ADx and ADy. When the data are latched by the first row address latch 3 and first column address latch 4, the row address buffer 1 and column address buffer 2 are powered off. Subsequently, the address data latched by the first row address latch 3 and first column address latch 4 are supplied to the second row address latch 5 and second column address latch 6, thereby executing the access operation.

As described above, two latch circuits are prepared for each of row and column addresses such that the addresses are latched by the second row address latch 5 and second column address latch 6. The addresses that are used internally are reset in the precharge cycle. The address data in the current cycle are kept stored in the first row address latch 3 and first column address latch 4.

When the current cycle is ended, and the signal CYCLE changes to "H" level, the row address buffer 1 and column address buffer 2 are powered on and activated. Addresses that are input at that time are latched and compared with the address data in the preceding cycle, which are latched by the first row address latch 3 and first column address latch 4. If the data do not coincide, the ATD AND circuit 13 generates the pulse signal (AND signal) ATDSUM.

Triggered by the pulse signal ATDSUM, the internal CE control circuit 14 generates the control signals INCE and CYCLE for a predetermined period to start the next cycle operation. If the address data coincide with those in the preceding cycle, no pulse signal ATDSUM is generated. Hence, data in the preceding cycle is continuously output as the output signal Dout.

FIG. 7 shows the detailed arrangement of the address buffers & latch circuits 29 and 30. This address buffer & latch circuit is constituted by a buffer section (corresponding to the row address buffer 1 or column address buffer 2) 31, a first latch section (corresponding to the row address latch 3 or column address latch 4) 32, and a second latch section (corresponding to the row address latch 5 or column address latch 6) 33.

The buffer section 31 includes PMOSFETs 41 and 42, NMOSFETs 43 and 44, and an inverter 45. The current paths of the MOSFETs 41, 42, and 43 are connected in series between a power supply VDD and a ground point VSS. One end of the current path of the MOSFET 44 is connected to a connection node NC between the current paths of the MOSFETs 42 and 43. The other end of the above current path is connected to the ground point VSS. A control signal PRE is supplied to the gates of the MOSFETs 41 and 44. An address signal ADin (row address signal ADx or column address signal ADy) is supplied to the gates of the MOSFETs 42 and 43. The input terminal of the inverter 45 is connected to the node NC.

The first latch section 32 includes transfer gates 46 and 47 and inverters 48 to 50. The output terminal of the inverter 45 is connected to one terminal of the transfer gate 46. The other terminal (node ND) is connected to the input terminal of the inverter 48 and one terminal of the transfer gate 47. The transfer gates 46 and 47 are complementarily ON/OFF-controlled in synchronism with control signals φ and /φ. The output terminal of the inverter 48 is connected to the input terminals of the inverters 49 and 50. The output terminal of the inverter 49 is connected to the other terminal of the transfer gate 47.

The second latch section 33 includes NAND circuits 51 and 52 and inverters 53 and 54. The output terminal of the inverter 50 is connected to one input terminal of the NAND circuit 51. A control signal RE is supplied to the other input terminal of the NAND circuit 51. The output terminal of the inverter 48 is connected to one input terminal of the NAND circuit 52. The control signal RE is supplied to the other input terminal of the NAND circuit 52. The input terminals of the inverters 53 and 54 are connected to the output terminals of the NAND circuits 51 and 52. Address outputs A and /A (internal row address signal Xn or internal column address signal Yn) are obtained from the output terminals of the inverters 53 and 54. A signal ATDin is output from the inverter 50.

In the above arrangement, assume that the address signal ADin (row address signal ADx or column address signal ADy) changes from "H" level to "L" level at time T1, as shown in the timing chart of FIG. 8. The control signal PRE is at "L" level. The MOSFET 41 is ON. The MOSFET 44 is OFF. The MOSFETs 42 and 43 are in an inverter operable state (a state in which the power is supplied to the buffer section 31). For these reasons, the node NC changes from "L" level to "H" level. Since the control signal φ is at "H" level (the control signal /φ is at "L" level), the transfer gate 46 is ON, and the transfer gate 47 is OFF. The node ND and signal ATDin change from "H" level to "L" level. Since the control signal RE is at "L" level, the address output A is at "L" level, and the address output /A (complementary signal) is at "L" level. After that, when the control signal RE changes from "L" level to "H" level, the address output complementary signal /A changes from "L" level to "H" level. At this time, the address output A remains at "L" level. With this operation, an internal address is decided.

Upon detecting the transition of the signal ATDin, the ATD AND circuit 13 generates a pulse signal. The cycle control signal CYCLE and internal chip enable signal INCE, which are output from the internal CE control circuit 14 triggered by the pulse signal, change from "L" level to "H" level. Accordingly, the operation cycle starts.

At time T2, the control signal φ changes from "H" level to "L" level. Accordingly, the transfer gate 46 is turned off, and the transfer gate 47 is turned on so that the buffer section 31 is electrically disconnected from the latch section 32. At this time, the control signal PRE changes from "L" level to "H" level. Accordingly, the MOSFET 41 is turned off, and the MOSFET 44 is turned on to cut off the power supply to the buffer section 31. In addition, the node NC changes from "H" level to "L" level. Since the transfer gate 47 of the first latch section 32 is ON, "L" level of the node ND is latched and held by the inverters 48 and 49.

At time T3, when the internal chip enable signal INCE changes from "H" level to "L" level, and the active operation is ended, the precharge operation is performed. When the precharge operation is ended, the control signal RE changes from "H" level to "L" level. Since the address output complementary signal /A changes from "H" level to "L" level, and the address output A is at "L" level, the internal address is reset.

Assume that the address signal ADin changes from "L" level to "H" level at time T4. Since the cycle control signal CYCLE is at "H" level, and the cycle operation is being executed, any other operation is performed.

At time T5, the cycle control signal CYCLE changes from "H" level to "L" level, and the preceding cycle is ended. The control signal PRE changes from "H" level to "L" level to supply the power to the buffer section 31. "H" level of the address signal ADin at that time is latched. However, since the transfer gate 46 is OFF, the node ND remains at "L" level.

Then, the control signal φ changes from "L" level to "H" level. Accordingly, the transfer gate 46 is turned on (the transfer gate 47 is kept OFF) to electrically connect the buffer section 31 to the latch section 32. Since the node ND and signal ATDin change from "L" level to "H" level, the ATD AND circuit 13 detects the transition of the signals and generates the pulse signal. Triggered by the pulse signal, the cycle control signal CYCLE and internal chip enable signal INCE change from "L" level to "H" level so that the next cycle starts.

The address transition that has occurred at time T4 is latched at time T5.

According to the above arrangement and access method, the address immediately before the start of the next cycle can be latched. Even when the address changes at certain point in the preceding cycle, the finally changed address data is latched. Hence, data corresponding to a desired address can be read or written without inputting an address complying with the TRCmin rule.

Each address buffer is activated simultaneously with the start of the cycle. Once data is latched by the latch section, the address buffer can be powered off to set it in an inactive state. For this reason, the power consumption can greatly be reduced.

For the first ATD pulse, the pulse width is set to a desired value. Even when the first ATD pulse is generated, and the second address change occurs immediately after it, a read or write corresponding to the second address change can be executed without delaying the cycle.

In the above-described first embodiment, the power supply to the address buffer is controlled by the control signal PRE. If a high operation speed is more important than the low power consumption, the control signal PRE may be kept at "L" level to always set the address buffer in the active state. With this arrangement, the address can quickly be received, and the access speed can be increased.

An inverter type address buffer circuit has been described above. However, the present invention is not limited to this. A well-known current mirror type or dynamic latch type circuit may be used. Any circuit arrangement can be used as long as it has a buffer section and latch section, which can be disconnected through a switch circuit.

[Second Embodiment]

In the semiconductor integrated circuit device according to the first embodiment and the access method therefor, a pseudo SRAM has been described, which uses, in the memory core portion, an array of ferroelectric cells MC1 each having a 1-transistor/1-capacitor structure and independently connected to the bit line BL and plate line PL. However, the present invention can also be applied to a pseudo SRAM which uses, in the memory core portion, a memory cell array in which a unit of TC parallel unit series-connected ferroelectric cells is connected to a bit line BL and plate line PL.

Figure 9A:
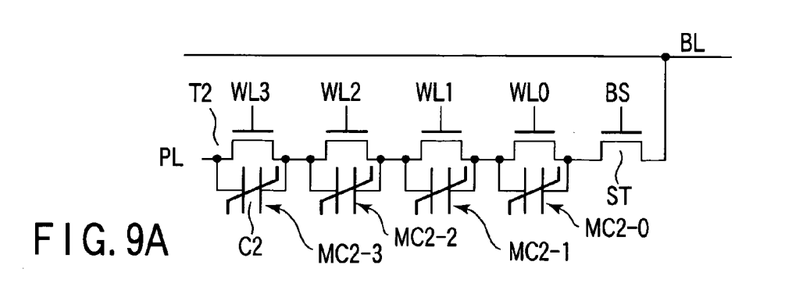
FIG. 9A is an equivalent circuit diagram showing one unit of TC parallel unit series-connected ferroelectric cells so as to explain a semiconductor integrated circuit device according to the second embodiment of the present invention and an access method therefor.
Figure 9B:
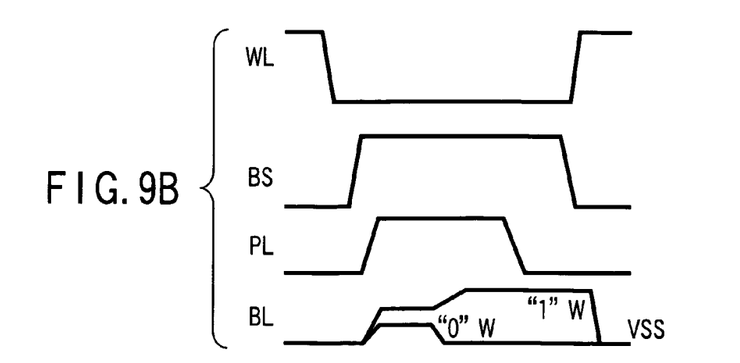
FIG. 9B is a timing chart showing the operation waveforms of the ferroelectric cell shown in FIG. 9A.

FIGS. 9A and 9B are, respectively, an equivalent circuit diagram of one unit of TC parallel unit series-connected ferroelectric cells and its operation waveforms.

In one unit of TC parallel unit series-connected ferroelectric cells shown in FIG. 9A, the current paths between a plurality of (in this example, four) ferroelectric cells MC2-0 to MC2-3 and one unit select transistor ST are connected in series between the bit line BL and plate line PL. Each of the ferroelectric cells MC2-0 to MC2-3 is constituted by connecting the current path of a cell transistor T2 and a ferroelectric capacitor C2 in parallel. The gates of the cell transistors T2 of the ferroelectric cells MC2-0 to MC2-3 are connected to word lines WL0 to WL3, respectively. The gate of the unit select transistor ST is connected to a unit select line BS.

Of the word lines WL0 to WL3, word lines except ones corresponding to the selected ferroelectric cell are set at "H" level. The cell transistors corresponding to these word lines are controlled to the ON state. Only one word line corresponding to the selected ferroelectric cell is set at "L" level. The cell transistor corresponding to this word line is controlled to the OFF state. One electrode of the cell capacitor of the selected ferroelectric cell is connected to the bit line BL. The other electrode is connected to the plate line PL.

Even with the above-described cell structure, almost the same functions and effects as in the above-described pseudo SRAM which uses, in the memory core portion, ferroelectric cells each having a 1-transistor/1-capacitor structure can basically be obtained.

[Third Embodiment]

In the semiconductor integrated circuit devices according to the first and second embodiments and the access methods therefor, pseudo SRAMs have been described, which use, in the memory core portion, the ferroelectric cells MC1 and MC2 each of which pulse-drives the potential of the plate line PL, as shown in FIGS. 5A to 9A.

In the third embodiment, DRAM cells each having a 1-transistor/1-capacitor structure are used in the memory core portion.

Figure 10A:
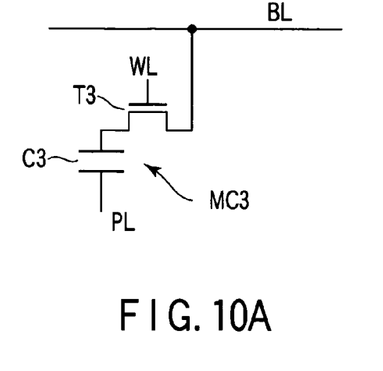
FIG. 10A is an equivalent circuit diagram showing a DRAM cell so as to explain a semiconductor integrated circuit device according to the third embodiment of the present invention and an access method therefor.

More specifically, DRAM cells MC3 each having a 1-transistor/1-capacitor structure shown in FIG. 10A are arranged in a matrix in a memory cell array 19. One end of the current path of a cell transistor T3 is connected to a bit line BL. The other end is connected to one electrode of a cell capacitor C3. The other electrode of the cell capacitor C3 is connected to a plate line PL.

Figure 10B:
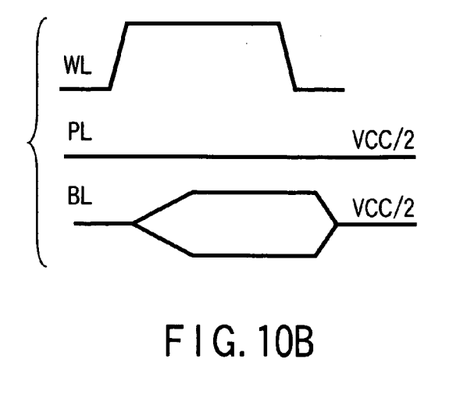
FIG. 10B is a timing chart showing the operation waveforms of the DRAM cell shown in FIG. 10A.

As shown in FIG. 10B, the precharge voltage of the bit line BL and the potential of the plate line PL are set to ½ a power supply voltage VCC. In this state, a word line WL is selected.

Even with the above-described structure, almost the same functions and effects as in the pseudo SRAMs described in the first and second embodiments, which use, in the memory core portion, the ferroelectric cells MC1 or MC2, can basically be obtained.

As described above, according to the semiconductor integrated circuit device of each embodiment of the present invention and the access method therefor, an asynchronous semiconductor memory device can be formed, that can reduce power consumption while eliminating the restriction on address input and also is compatible to an asynchronous SRAM in terms of operation, unlike the prior art.

Figure 11:
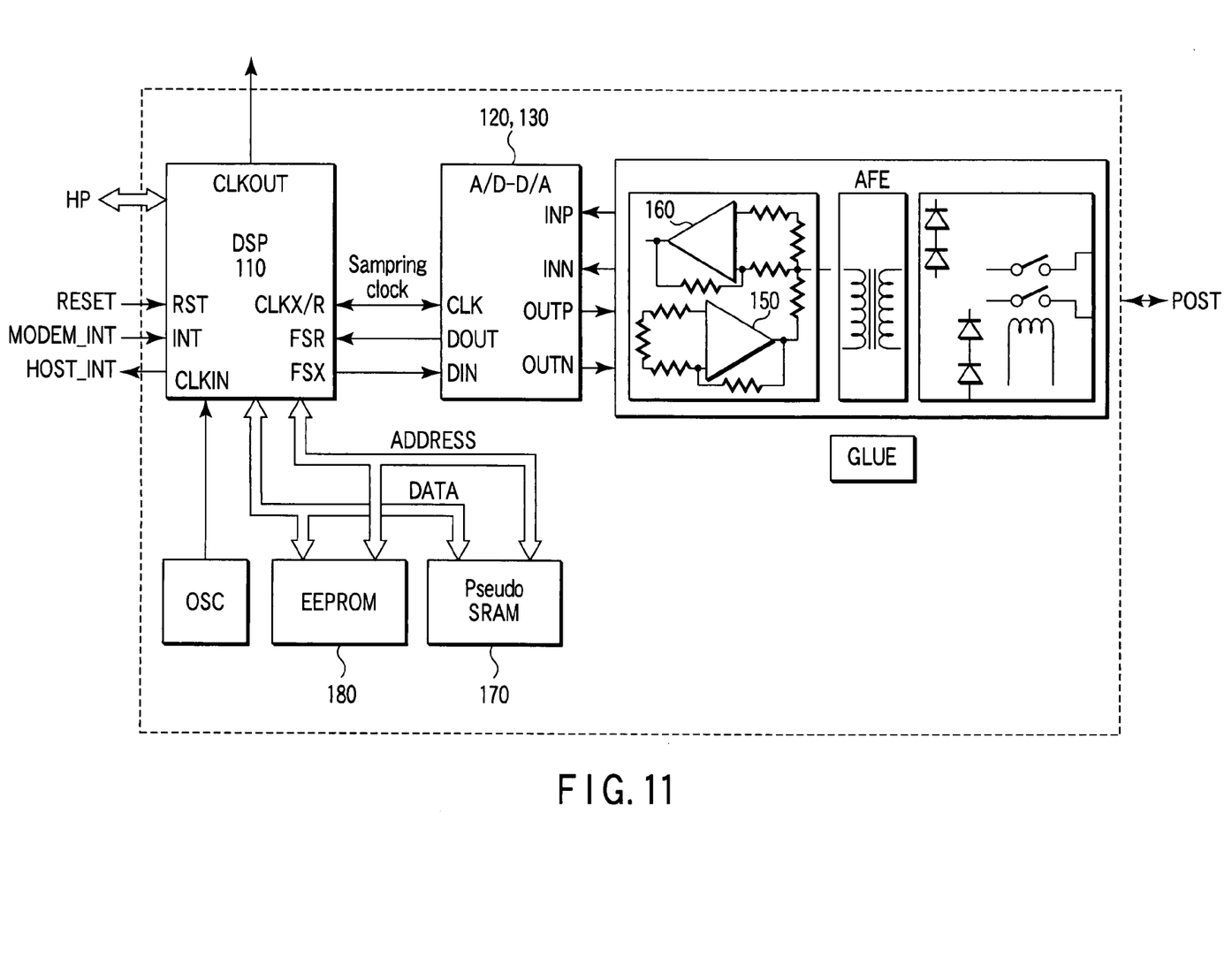
FIG. 11 is a block diagram showing the DSL (Digital Subscriber Line) data path portion of a DSL modem so as to explain Application Example 1 of the semiconductor integrated circuit devices (pseudo SRAMs) according to the first and second embodiments of the present invention.
Figure 12:
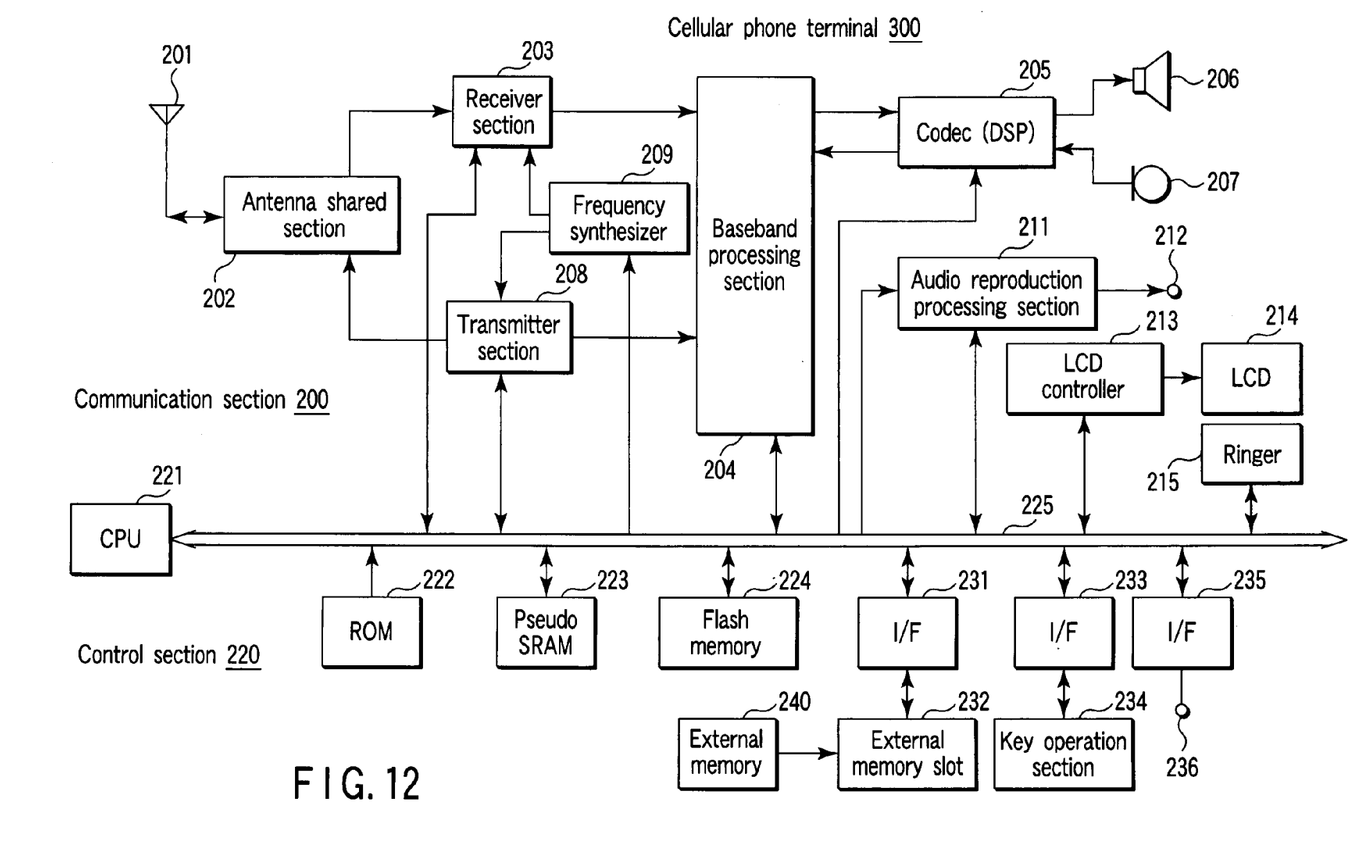
FIG. 12 is a block diagram showing a cellular phone terminal so as to explain Application Example 2 of the semiconductor integrated circuit devices (pseudo SRAMs) according to the first and second embodiments of the present invention.
Figure 13:
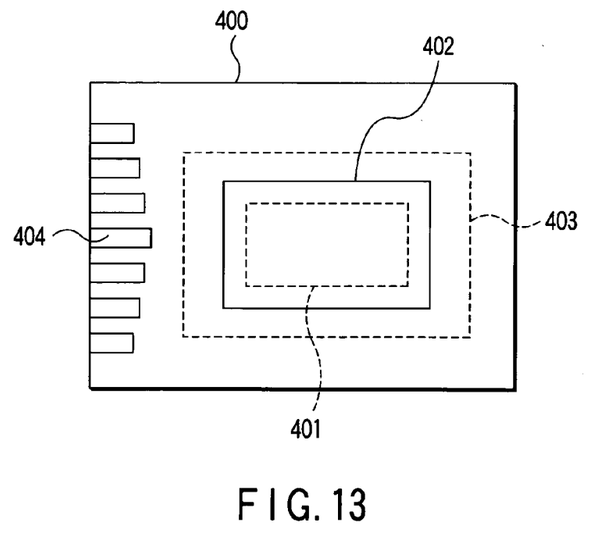
FIG. 13 is a plan view showing an example in which a pseudo SRAM is applied to a card such as a smart medium which stores media contents so as to explain Application Example 3 of the semiconductor integrated circuit devices (pseudo SRAMs) according to the first and second embodiments of the present invention.

The semiconductor integrated circuit devices according to the above-described first to third embodiments of the present invention can be applied to various apparatuses in place of existing SRAMs. Especially, the semiconductor integrated circuit devices according to the first and second embodiments use a ferroelectric memory in the memory core portion and can be applied to, e.g., optional memories of various types or cards which store media contents by using nonvolatility. FIGS. 11 to 13 show application examples.

(Application Example 1)

FIG. 11 shows the DSL (Digital Subscriber Line) data path portion of a DSL modem. This modem includes a programmable digital signal processor (DSP) 110, analog/digital (A/D) converter 120, digital/analog (D/A) converter 130, transmission driver 150, and receiver amplifier 160. FIG. 11 does not illustrate a bandpass filter. Instead, a pseudo SRAM 170 according to one of the embodiments and an EEPROM 180 are illustrated as optional memories of various types to hold a line code program (a program which is executed by the DSP to select and operate a modem in accordance with encoded subscriber line information and transmission conditions (line code; QAM, CAP, RSK, FM, AM, PAM, DWMT, and the like)).

In Application Example 1, two kinds of memories, i.e., the pseudo SRAM 170 and EEPROM 180 are used as memories to hold the line code program. The EEPROM 180 may be replaced with a pseudo SRAM. That is, instead of using two types of memories, only pseudo SRAMs may be used.

(Application Example 2)

FIG. 12 shows a cellular phone terminal 300 as another application example. A communication section 200 which implements a communication function comprises a transmitting/receiving antenna 201, an antenna shared section 202, a receiver section 203, a baseband processing section 204, a DSP 205 used as a voice codec, a loudspeaker (receiver) 206, a microphone (transmitter) 207, a transmitter section 208, and a frequency synthesizer 209.

The cellular phone terminal 300 has a control section 220 which controls the sections of the cellular phone terminal. The control section 220 is a microcomputer which is formed by connecting a CPU 221, a ROM 222, a pseudo SRAM 223 according to one of the embodiments, and a flash memory 224 through a CPU bus 225. The ROM 222 stores, in advance, a program to be executed by the CPU 221 and necessary data such as fonts to be displayed. The pseudo SRAM 223 is mainly used as a work area where the CPU 221 stores, as needed, data midway through calculation during executing the program, or data exchanged between the control section 220 and the respective sections are temporarily stored. Even when the cellular phone terminal 300 is powered off, the flash memory 224 stores, e.g., the immediately preceding set conditions, so the same set conditions can be used when the cellular phone terminal is powered on again. Accordingly, even when the cellular phone terminal is powered off, the stored set parameters are not erased.

The cellular phone terminal 300 also has an audio reproduction processing section 211, an external output terminal 212, an LCD (Liquid Crystal Display) controller 213, an LCD 214 for display, and a ringer 215 which generates a ringing signal. The audio reproduction processing section 211 reproduces audio information input to the cellular phone terminal 300 (or audio information stored in an external memory 240 (to be described later)). The audio information that is reproduced can be transmitted to a headphone or a portable loudspeaker through the external output terminal 212 and extracted to the outside. When the audio reproduction processing section 211 is prepared, audio information can be reproduced. The LCD controller 213 receives display information from, e.g., the CPU 221 through the CPU bus 225, converts the display information into LCD control information to control the LCD 214, and drives the LCD 214 to cause it to perform display.

The cellular phone terminal 300 also has interface circuits (I/Fs) 231, 233, and 235, the external memory 240, an external memory slot 232, a key operation section 234, and an external input/output terminal 236. The external memory slot 232 receives the external memory 240 such as a memory card. The external memory slot 232 is connected to the CPU bus 225 through the interface circuit (I/F) 231. As described above, when the slot 232 is prepared in the cellular phone terminal 300, information in the cellular phone terminal 300 can be written in the external memory 240. Alternatively, information (e.g., audio information) stored in the external memory 240 can be input to the cellular phone terminal 300. The key operation section 234 is connected to the CPU bus 225 through the interface circuit (I/F) 233. Key input information input from the key operation section 234 is transmitted to, e.g., the CPU 221. The external input/output terminal 236 is connected to the CPU bus 225 through the interface circuit (I/F) 233 and functions as a terminal in inputting various kinds of external information to the cellular phone terminal 300 or outputting information externally from the cellular phone terminal 300.

In Application Example 2, the ROM 222, pseudo SRAM 223, and flash memory 224 are used. Since the flash memory 224 is nonvolatile, it may be replaced with a pseudo SRAM. The ROM 222 may also be replaced with a pseudo SRAM.

(Application Example 3)

FIG. 13 shows an example in which a pseudo SRAM is applied to a card as a smart medium which stores media contents.

A card main body 400 incorporates a pseudo SRAM chip 401. An opening portion 402 is formed in the card main body 400 at a position corresponding to the pseudo SRAM chip 401 so the pseudo SRAM chip 401 is exposed. The opening portion 402 has a shutter 403. When the card is carried, the pseudo SRAM chip 401 is protected by the shutter 403. When data is to be written, the shutter 403 is opened to expose the pseudo SRAM chip 401. An external terminal 404 is used to extract content data stored in the card. If the number of external terminals 404 is not limited, data may be written through only the external terminals 404 without forming the opening portion 402 at the position corresponding to the pseudo SRAM chip 401.

According to the arrangements of Application Examples 1 to 3, the advantages of the pseudo SRAM, i.e., no limit on address input, low power consumption, an asynchronous operation for an external input signal, a relatively high operation speed, and nonvolatility can be effectively used.

A pseudo SRAM has been exemplified above as a semiconductor integrated circuit device. However, the present invention can also be applied to a semiconductor integrated circuit device in which a pseudo SRAM and logic circuit are embedded, or a semiconductor integrated circuit device called a SOC in which a system is mounted in one chip.

As described above, according to one aspect of this invention, a semiconductor integrated circuit device that can reduce power consumption while eliminating the restriction on address input and an access method therefor can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array;
an address buffer which receives an address signal that indicates an address of the memory cell array;
a latch circuit which latches the address signal output from the address buffer;
an address transition detection circuit which detects transition of the address signal latched by the latch circuit upon receiving an address different from that latched by the latch circuit; and
a control circuit which comprises a timeout circuit that controls a cycle operation of the memory cell array, controls operations of the address buffer and the latch circuit, causes the latch circuit to latch an address at operation start time, which is output from the address buffer, during the operation of the memory cell array, when the address transition detection circuit detects the transition of the address during the cycle operation, causes the latch circuit to latch, after an end of the operation of the memory cell array, an address that is currently input to the address buffer, and controls to execute the next cycle operation of the memory cell array in accordance with the address latched by the latch circuit.

2. The device according to claim 1, wherein the address buffer is activated immediately before the start of the operation of the memory cell array under control of the control circuit and inactivated during the operation of the memory cell array after the address is latched by the latch circuit.

3. The device according to claim 2, wherein the activation/inactivation of the address buffer is controlled by supplying/cutting off a power.

4. The device according to claim 1, which further comprises a switch which is inserted between the address buffer and the latch circuit and ON/OFF-controlled by a first control signal output from the control circuit, and
in which the address buffer and the latch circuit are set in a connected/disconnected state in accordance with the ON/OFF state of the switch.

5. The device according to claim 4, wherein the address transition detection circuit detects the transition of the address in a state in which the switch is turned off to disconnect the address buffer from the latch circuit.

6. The device according to claim 1, wherein the latch circuit comprises a first latch section which latches the output signal from the address buffer in response to a second control signal output from the control circuit, and a second latch section which latches an output signal from the first latch section and generates a complementary signal in response to a third control signal output from the control circuit.

7. The device according to claim 6, wherein the address transition detection circuit detects the transition of the address on the basis of the output signal from the first latch section.

8. The device according to claim 1, wherein the memory cell array is constituted by arraying ferroelectric cells in a matrix.

9. The device according to claim 1, wherein the memory cell array is constituted by arraying TC parallel unit series-connected ferroelectric cells in a matrix.

10. The device according to claim 1, wherein the memory cell array is constituted by arraying dynamic cells in a matrix.

11. A semiconductor integrated circuit device comprising:
a memory cell array;
a row address buffer which receives a row address signal that indicates a row address of the memory cell array;
a column address buffer which receives a column address signal that indicates a column address of the memory cell array;
a CE buffer which receives an external chip enable signal;
a WE buffer which receives an external write enable signal;
a first row address latch which latches the row address signal output from the row address buffer;
a second row address latch which latches the row address signal output from the first row address latch and outputs an internal row address signal;
a first column address latch which latches the column address signal output from the column address buffer;
a second column address latch which latches the column address signal output from the first column address latch and outputs an internal column address signal;
a row address transition detection circuit which detects transition of the row address signal output from the first row address latch;
a column address transition detection circuit which detects transition of the column address signal output from the first column address latch;
a chip enable transition detection circuit which detects transition of the external chip enable signal output from the CE buffer;
a write enable transition detection circuit which detects transition of the external write enable signal output from the WE buffer;
an ATD AND circuit which ANDs detection results from the row address transition detection circuit, the column address transition detection circuit, the chip enable transition detection circuit, and the write enable transition detection circuit; and
an internal CE control circuit which comprises a timeout circuit that controls a cycle operation of the memory cell array, controls a row system circuit and a column system circuit to access the memory cell array and also controls the row address buffer, the column address buffer, the first and second row address latches, and the first and second column address latches on the basis of an AND signal output from the ATD AND circuit, causes the first and second row address latches and the first and second column address latches to respectively latch a row address and a column address at operation start time, which are output from the row address buffer and the column address buffer, during the operation of the memory cell array, and when the row address transition detection circuit detects the transition of the row address or the column address transition detection circuit detects the transition of the column address during the cycle operation, causes the second row address latch and the second column address latch to respectively latch, after an end of the operation of the memory cell array, a row address and a column address that are currently latched by the first row address latch and the first column address latch so as to control access to the memory cell array.

12. The device according to claim 11, wherein the row address buffer and the column address buffer are activated immediately before the start of the operation of the memory cell array under control of the internal CE control circuit and inactivated during the operation of the memory cell array after the row address signal and the column address signal are latched by the first row address latch and the first column address latch.

13. The device according to claim 12, wherein the activation/inactivation of the row address buffer and the column address buffer is controlled by controlling power on/off in response to a first control signal output from the internal CE control circuit.

14. The device according to claim 11, which further comprises a first switch which is arranged on an input side of the first row address latch and ON/OFF-controlled by a first control signal output from the internal CE control circuit, and a second switch which is arranged on an input side of the first column address latch and ON/OFF-controlled by the first control signal output from the internal CE control circuit, and in which the row address buffer and the first row address latch are set in a connected/disconnected state in accordance with the ON/OFF state of the first switch, and the column address buffer and the first column address latch are set in a connected/disconnected state in accordance with the ON/OFF state of the second switch.

15. The device according to claim 14, wherein the row address transition detection circuit and the column address transition detection circuit detect the transitions of the row address and the column address in a state in which the first and second switches are turned off to disconnect the row address buffer from the first row address latch and disconnect the column address buffer from the first column address latch.

16. The device according to claim 11, wherein the second row address latch supplies, to the row system circuit, the internal row address signal in response to a second control signal output from the CE control circuit, and the second column address latch supplies, to the column system circuit, the internal column address signal in response to the second control signal output from the CE control circuit.

17. The device according to claim 11, wherein the memory cell array is constituted by arraying ferroelectric cells in a matrix.

18. The device according to claim 11, wherein the memory cell array is constituted by arraying TC parallel unit series-connected ferroelectric cells in a matrix.

19. The device according to claim 11, wherein the memory cell array is constituted by arraying dynamic cells in a matrix.

20. An access method for a semiconductor integrated circuit device including a memory cell array, an address buffer which receives an address signal that indicates an address of the memory cell array, a latch circuit which latches the address output from the address buffer, an address transition detection circuit which detects transition of the address, and a control circuit which comprises a timeout circuit that controls a cycle operation of the memory cell array on the basis of a detection result from the address transition detection circuit, comprising:

causing the latch circuit to latch an address at operation start time during the operation of the memory cell array;

causing the address transition detection circuit to detect the transition of the address during the cycle operation;

when the transition of the address is detected, causing the latch circuit to latch, after an end of the operation of the memory cell array, an address that is currently input to the address buffer; and executing the next cycle operation of the memory cell array in accordance with the address latched by the latch circuit.

21. An access method for a semiconductor integrated circuit device including a memory cell array, a row address buffer which receives a row address signal that indicates a row address of the memory cell array, a column address buffer which receives a column address signal that indicates a column address of the memory cell array, a CE buffer which receives an external chip enable signal, a WE buffer which receives an external write enable signal, a first row address latch which latches the row address signal output from the row address buffer, a second row address latch which latches the row address signal output from the first row address latch and outputs an internal row address signal, a first column address latch which latches the column address signal output from the column address buffer, a second column address latch which latches the column address signal output from the first column address latch and outputs an internal column address signal, a row address transition detection circuit which detects transition of the row address signal output from the first row address latch, a column address transition detection circuit which detects transition of the column address signal output from the first column address latch, a chip enable transition detection circuit which detects transition of the external chip enable signal output from the CE buffer, a write enable transition detection circuit which detects transition of the external write enable signal output from the WE buffer, an ATD AND circuit which ANDs detection results from the row address transition detection circuit, the column address transition detection circuit, the chip enable transition detection circuit, and the write enable transition detection circuit, and an internal CE control circuit which comprises a timeout circuit that controls a cycle operation of the memory cell array, controls a row system circuit and a column system circuit to access the memory cell array, and also controls the row address buffer, the column address buffer, the first and second row address latches, and the first and second column address latches on the basis of an AND signal output from the ATD AND circuit, comprising:

causing the first and second row address latches and the first and second column address latches to respectively latch a row address and a column address at operation start time, which are output from the row address buffer and the column address buffer, during the operation of the memory cell array;

causing the row address transition detection circuit to detect the transition of the row address or causing the column address transition detection circuit to detect the transition of the column address during the cycle operation;

when the transition of the row address or column address is detected, causing the second row address latch and the second column address latch to respectively latch, after an end of the operation of the memory cell array, a row address and a column address that are currently latched by the first row address latch and the first column address latch; and executing the next cycle operation of the memory cell array in accordance with the addresses latched by the second row address latch and the second column address latch.

* * * * *